United States Patent
Nam et al.

(10) Patent No.: US 10,516,054 B2
(45) Date of Patent: Dec. 24, 2019

(54) ELECTRONIC DEVICE INCLUDING TWO-DIMENSIONAL MATERIAL

(71) Applicants: Samsung Electronics Co., Ltd., Suwon-si, Gyeonggi-do (KR); Research & Business Foundation Sungkyunkwan University, Suwon-Si, Gyeonggi-Do (KR)

(72) Inventors: Seunggeol Nam, Suwon-si (KR); Wonjong Yoo, Suwon-si (KR); Zheng Yang, Suwon-si (KR)

(73) Assignees: Research & Business Foundation Sungkyunkwan University, Gyeonggi-do (KR); Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/423,035

(22) Filed: Feb. 2, 2017

(65) Prior Publication Data
US 2018/0040737 A1 Feb. 8, 2018

(30) Foreign Application Priority Data
Aug. 4, 2016 (KR) .................. 10-2016-0099620

(51) Int. Cl.
*H01L 29/786* (2006.01)
*H01L 29/24* (2006.01)
(Continued)

(52) U.S. Cl.
CPC ........ *H01L 29/78618* (2013.01); *H01L 29/24* (2013.01); *H01L 29/45* (2013.01);
(Continued)

(58) Field of Classification Search
CPC ......... H01L 29/78618; H01L 29/66969; H01L 29/24; H01L 29/78681; H01L 29/78696; H01L 29/778; H01L 29/45; H01L 29/861
See application file for complete search history.

(56) References Cited

U.S. PATENT DOCUMENTS

2002/0024349 A1* 2/2002 Hirayama ............ G01N 25/486
324/762.01
2009/0057656 A1* 3/2009 Matsubara .......... H01L 51/0068
257/40

(Continued)

FOREIGN PATENT DOCUMENTS

| KR | 20160010217 A | 1/2016 |
| WO | WO-2013/063399 A1 | 5/2013 |
| WO | WO-2015/021479 A1 | 2/2015 |

OTHER PUBLICATIONS

Michaelson, "The work function of the elements and its periodicity", Jul. 6, 1977, Journal of Applied Physics, 48, 4729, pp. 4729-4733.*

(Continued)

*Primary Examiner* — Steven H Loke
*Assistant Examiner* — Juanita B Rhodes
(74) *Attorney, Agent, or Firm* — Harness, Dickey & Pierce, P.L.C.

(57) ABSTRACT

Provided are electronic devices having a two-dimensional (2D) material layer. The electronic device includes an electrode layer that directly contacts an edge of the 2D material layer. The electrode layer may include a conductive material having a high work function or may have a structure in which an electrode layer includes a conductive material having a high work function and an electrode layer includes a conductive material having a low work function.

16 Claims, 6 Drawing Sheets

(51) Int. Cl.
  *H01L 29/66* (2006.01)
  *H01L 29/45* (2006.01)
  *H01L 29/778* (2006.01)
  *H01L 29/861* (2006.01)

(52) U.S. Cl.
  CPC ...... *H01L 29/66969* (2013.01); *H01L 29/778* (2013.01); *H01L 29/78681* (2013.01); *H01L 29/78696* (2013.01); *H01L 29/861* (2013.01)

(56) References Cited

U.S. PATENT DOCUMENTS

| | | | | |
|---|---|---|---|---|
| 2013/0105824 | A1* | 5/2013 | Paranjape | H01L 31/032 257/86 |
| 2015/0221499 | A1* | 8/2015 | Park | H01L 29/1606 257/29 |
| 2015/0340522 | A1* | 11/2015 | Choi | H01L 31/18 257/432 |
| 2016/0141427 | A1* | 5/2016 | Chen | H01L 29/78696 257/349 |
| 2017/0102357 | A1* | 4/2017 | Liang | G01N 27/4145 |
| 2017/0133468 | A1* | 5/2017 | Colombo | H01L 29/401 |
| 2018/0114839 | A1* | 4/2018 | Wu | H01L 29/045 |
| 2018/0148830 | A1* | 5/2018 | Ohmi | C23C 14/185 |

OTHER PUBLICATIONS

Michaelson, "The work function of the elements and its periodicity", Jul. 6, 1977, Journal of Applied Physics, 48, 4729, pp. 4729-4733. (Year: 1977).*

Cui, et al. "Multi-terminal electrical transport measurements of molybdenum disulphide using van der Waals heterostructure device platform," Materials Science (2014).

Das, et al. "High Performance Multilayer MoS2 Transistors with Scandium Contacts," Nano Letters, (2014).

D. Liu et al. "Sulfur vacancies in monolayer $MoS_2$ and its electrical contacts" Appl. Phys. Lett. 103, 183113 (2013); doi: 10.1063/1.4824893.

J. Kang et al. "Computational Study of Metal Contacts to Monolayer Transition-Metal Dichalcogenide Semiconductors" Physical Review X 4, 031005 (2014).

Y. Su et al. "Symmetric complementary logic inverter using integrated black phosphorus and $MoS_2$ transistors" IOP Publishing, 2D Mater.3 (2016) 011006.

S. Das et al. "Ambipolar Phosphorene Field Effect Transistor" American Chemical Society, vol. 8, No. 11, p. 11730-11738 (2014).

H. Liu et al. "Phosphorene: An Unexplored 2D Semiconductor with a High Hole Mobility" American Chemical Society, vol. 8, No. 4, p. 4033-4041 (2014).

J. Hong et al. "Exploring atomic defects in molybdenum disulphide monolayers" Nature Communications, 6:6293, DOI 10.1038 (2015).

* cited by examiner

ELECTRONIC DEVICE INCLUDING TWO-DIMENSIONAL MATERIAL

CROSS-REFERENCE TO RELATED APPLICATION

This application claims priority under 35 U.S.C. § 119 to Korean Patent Application No. 10-2016-0099620, filed on Aug. 4, 2016, in the Korean Intellectual Property Office, the disclosure of which is incorporated herein in its entirety by reference.

BACKGROUND

1. Field

The present disclosure relates to electronic devices including a two-dimensional (2D) material layer having a p-type or an ambipolar characteristic.

2. Description of the Related Art

With the development of electronic device industries, research into miniaturization and integration of electronic devices has been conducted. Interest in two-dimensional (2D) materials has increased.

2D materials denote materials having a single-layer or a half-layer structure in which atoms form a desired and/or alternatively predetermined crystal structure. The 2D material has drawn attention as a material that can overcome certain limitations of existing materials. Also, 2D materials may be applied to various devices. However, there are also certain considerations in applying the 2D materials to electronic devices.

SUMMARY

Provided are electronic devices including a two-dimensional (2D) material layer having a p-type or an ambipolar characteristic.

Provided are methods of manufacturing electronic devices including a 2D material layer having a p-type or an ambipolar characteristic.

Additional aspects will be set forth in part in the description which follows and, in part, will be apparent from the description, or may be learned by practice of the presented embodiments.

According to some example embodiments, an electronic device may include: a gate electrode; a gate insulating layer on the gate electrode; a 2D material layer on the gate insulating layer above the gate electrode; an insulating layer on the 2D material layer; and an electrode layer contacting an edge of the 2D material layer. The electrode layer has a high work function.

In some example embodiments, the electrode layer may have a work function in a range from 5.0 eV to 6.5 eV.

In some example embodiments, the insulating layer may include an opening that exposes the 2D material layer, the electrode layer may directly contact the edge of the 2D material layer through the opening in the insulating layer, and the electrode layer may be on a surface of the gate insulating layer.

In some example embodiments, the electrode layer may include first and second electrode layers respectively. The opening in the insulating layer may include a first opening and a second opening. The first electrode layer and the second electrode layer may directly contact edges of the 2D material layer on the surface of the gate insulating layer.

In some example embodiments, the 2D material layer may include a transition metal chalcogenide based material.

In some example embodiments, the 2D material layer may include one of $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, and $ReSe_2$.

In some example embodiments, the insulating layer may include a 2D material layer including one of h-BN and $Al_2O_3$.

According to some example embodiments, an electronic device may include a gate electrode; a gate insulating layer on the gate electrode; a 2D material layer on the gate insulating layer above the gate electrode; an insulating layer on the 2D material layer; and electrode layers contacting edges of the 2D material layer and having work functions different from each other.

In some example embodiments, the electrode layers may include a first electrode layer and a second electrode layer. The first electrode layer may have a work function greater than 3 eV and less than 5 eV. The second electrode layer may have a work function in a range from 5.0 eV to 6.5 eV.

In some example embodiments, the first electrode layer may include a 1-1 electrode layer and a 1-2 electrode layer, the second electrode layer may include a 2-1 electrode layer and a 2-2 electrode layer, the 1-1 electrode layer may be arranged on a first region of the electronic device, the 2-2 electrode layer may be arranged on a second region of the electronic device, and the 1-2 electrode layer and the 2-1 electrode layer may be arranged on a third region of the electronic device between the first and second regions.

In some example embodiments, an n-type contact region may be on a region where the first electrode layer contacts one of the edges of the 2D material layer, and a p-type contact region may be on a region where the second electrode layer contacts one of the edges of the 2D material layer.

BRIEF DESCRIPTION OF THE DRAWINGS

These and/or other aspects will become apparent and more readily appreciated from the following description of some example embodiments, taken in conjunction with the accompanying drawings in which.

DETAILED DESCRIPTION

Electronic devices including a two-dimensional (2D) material layer according to some example embodiments will now be described in detail with reference to the accompanying drawings. In the drawings, widths and thicknesses of layers and regions may be exaggerated for clarity of the specification and like reference numerals refer to like elements throughout. It will also be understood that when an element is referred to as being "on" or "above" another element, the element may be in direct contact with the other element or other intervening elements may be present.

Figure 1:
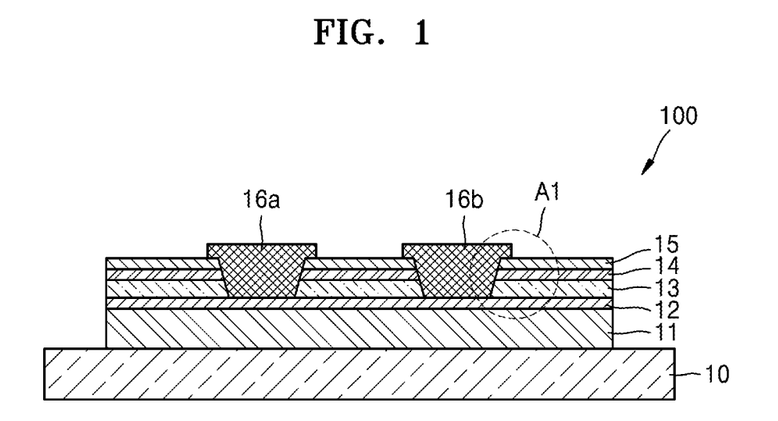
FIG. 1 is a schematic cross-sectional view of an electronic device including a two-dimensional (2D) material layer, according to some example embodiments.

FIG. 1 is a schematic cross-sectional view of an electronic device 100 including a 2D material layer, according to some example embodiments.

Referring to FIG. 1, the electronic device 100 to some example embodiments may include a gate electrode 11 on a lower structure 10, a gate insulating layer 12 on the gate electrode 11, a 2D material layer 13 on the gate insulating layer 12, and an insulating layer 14 on the 2D material layer 13. Also, a surface material layer 15 may be optionally formed on the insulating layer 14. Also, the electronic device 100 may include a first electrode layer 16a and a second electrode layer 16b respectively formed in contact with edges of the 2D material layer 13 on a surface of the gate insulating layer 12 by opening the 2D material layer 13, the insulating layer 14, and the surface material layer 15.

The first electrode layer 16a and the second electrode layer 16b respectively may be a source layer and a drain layer. At least one of the first electrode layer 16a and the second electrode layer 16b may be formed to directly contact a side surface of the 2D material layer 13.

Figure 2A:
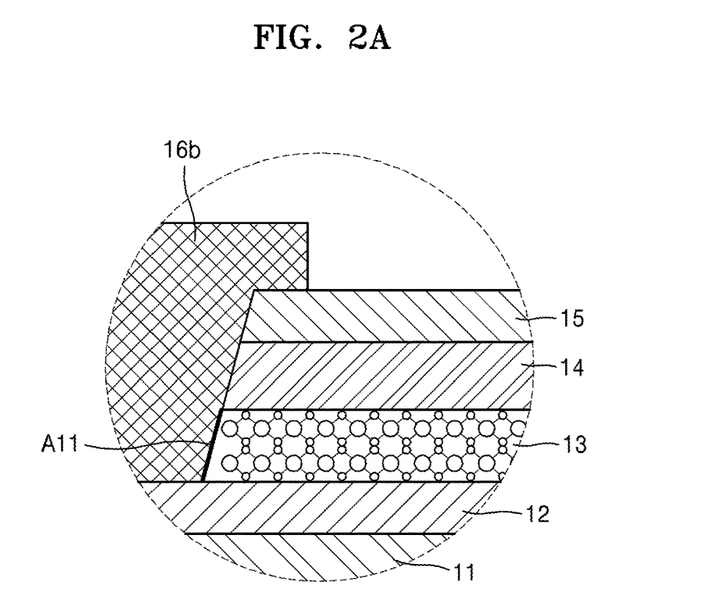
FIGS. 2A and 2B are magnified views of a region A1 of the electronic device including a 2D material layer of FIG. 1.
Figure 2B:
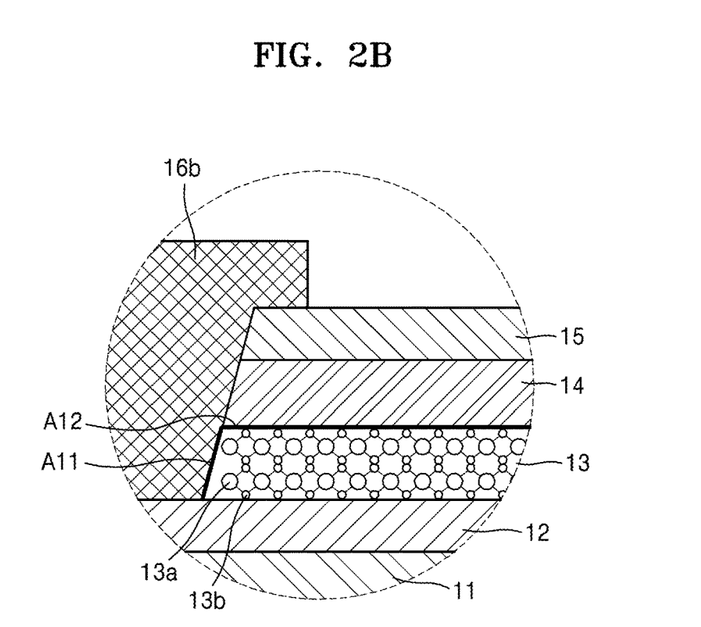

FIGS. 2A and 2B are magnified views of a region A1 of the electronic device including a 2D material layer of FIG. 1. Here, the region A1 clearly shows a contact region between the 2D material layer 13 and the second electrode layer 16b.

Referring to FIG. 2A, a edge of the 2D material layer 13 is formed by directly contacting the second electrode layer 16b on the gate electrode 11 and the gate insulating layer 12. The 2D material layer 13 may be formed by including a 2D material. The 2D material may have a single-layer or a half-layer structure in which atoms form a desired and/or alternatively predetermined crystal structure. However, the 2D material is not limited thereto, and may have a plurality of atom layers. The 2D material layer 13 and the second electrode layer 16b may directly contact each other at an edge region A11 of the 2D material layer 13.

Referring to FIG. 2B, the 2D material layer 13 may include the edge region A11 and a plain region A12, and, in the electronic device 100 according to some example embodiments of FIG. 1, the 2D material layer 13 may directly contact the first electrode layer 16a and the second electrode layer 16b at the edge region A11 of the 2D material layer 13. The 2D material layer 13 may be, for example, a $MoS_2$ layer.

The 2D material layer 13 of FIG. 2B is formed by a crystal structure of Mo atoms 13a and S atoms 13b. When the second electrode layer 16b contacts the 2D material layer 13 at the plain region A12 of the 2D material layer 13, a conductive material that constitutes the second electrode layer 16b may contact the S atoms 13b of the 2D material layer 13. However, when the second electrode layer 16b contacts the 2D material layer 13 at the edge region A11 of the 2D material layer 13 in a $MoS_2$ crystal structure, a conductive material that constitutes the second electrode layer 16b may contact both of the Mo atoms 13a and the S atoms 13b of the 2D material layer 13. When the second electrode layer 16b contacts the 2D material layer 13 at the plain region A12 of the 2D material layer 13, it may be referred to as a 2-D contact, and when the second electrode layer 16b contacts the 2D material layer 13 at the edge region A11 of the 2D material layer 13, it may be referred to as a 1-D contact.

If the first and second electrode layers 16a and 16b contact the 2D material layer 13 at the plain region A12 of the 2D material layer 13, a surface contact region between the first and second electrode layers 16a and 16b and the 2D material layer 13 may form a relatively weak bond. Accordingly, energy levels of the S atoms 13a and a metal that constitutes the first and second electrode layers 16a and 16b may overlap with each other, and thus, a strong Fermi level pinning effect that is fixed near a Fermi level conduction band may be induced. In this case, intrinsic $MoS_2$ always may have an n-type semiconductor characteristic.

However, when the first and second electrode layers 16a and 16b contact the 2D material layer 13 at the edge region A11 of the 2D material layer 13, the surface contact region between the first and second electrode layers 16a and 16b and the 2D material layer 13 may form a relatively strong bond. Accordingly, the Fermi level pinning effect of the 2D material layer 13 may be limited and/or prevented. That is, a Fermi level depinning of a material that constitutes the 2D material layer 13 may be induced by forming the first and second electrode layers 16a and 16b to contact the 2D material layer 13 at the edge region A11 of the 2D material layer 13. In this case, the 2D material layer 13 may have a p-type or an n-type characteristic depending on the material that constitutes the first electrode layer 16a and the second electrode layer 16b. For example, if the first and second electrode layers 16a and 16b that contact the 2D material layer 13 include a material having a low work function, an n-type Schottky contact may be obtained at the edge region A11 of the 2D material layer 13 where the first and second electrode layers 16a and 16b contact the 2D material layer 13.

In some example embodiments, a material having a low work function may denote a conductive material having a work function smaller than 5 eV, and a material having a high work function may denote a conductive material having a work function greater than 5 eV. In detail, a material having a low work function may denote a material having a work function approximately greater than 3 eV and less than 5 eV, such as Al, Fe, Pb, In, Au, and Mo. Also, a material having a high work function may denote a material having a work function approximately greater than 5 eV and not more than 6.5 eV, such as Au, Pt, and Pd. Accordingly, in the electronic device 100 according to some example embodiments, the electronic device 100 may be formed as a p-type electronic device if the first and second electrode layers 16a and 16b are formed at the edge region A11 of the 2D material layer 13 by using a conductive material having a high work function.

FIGS. 3A through 3E are cross-sectional views illustrating a method of manufacturing the electronic device 100 including a 2D material layer, according to some example embodiments.

Figure 3A:
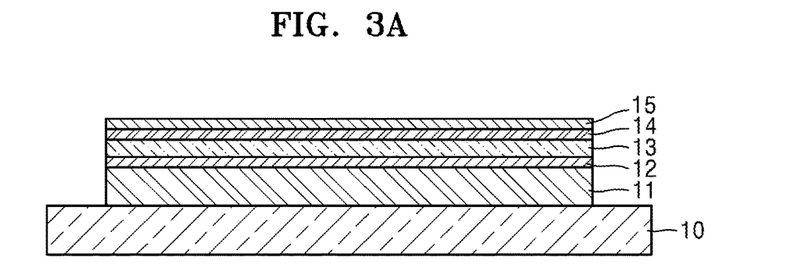
FIGS. 3A through 3E are cross-sectional views illustrating a method of manufacturing an electronic device including a 2D material layer, according to some example embodiments.

Referring to FIG. 3A, the gate electrode 11 is formed on the lower structure 10, and the gate insulating layer 12 is formed on the gate electrode 11. Also, the 2D material layer 13 is formed on the gate insulating layer 12, and the insulating layer 14 and the surface material layer 15 are formed on the 2D material layer 13.

The lower structure 10 may be another material layer or a substrate, for example, a silicon layer on which the electronic device 100 is formed. The gate electrode 11 may be formed by including a conductive metal material and may include a metal, a conductive metal oxide, and a conductive metal nitride. For example, the gate electrode 11 may be formed of a conductive material, such as a metal, an alloy, a conductive oxide, or a conductive nitride. For example the gate electrode 11 may include a metal, such as Au, Ag, Cu, Pt, Al, Ti, W, Ru, or Ta or an alloy of these metals.

The gate insulating layer 12 may include a silicon oxide, a silicon nitride, a hafnium oxide, an aluminum oxide, a tantalum oxide, or a titanium oxide.

The 2D material layer 13 may be formed by including a transition metal chalcogenide based material. The transition metal chalcogenide based material may be a transition metal dichalcogenide (TMDC) material including a transition metal and a chalcogen material. The transition metal may be at least one of Mo, W, Nb, V, Ta, Ti, Zr, Hf, Tc, and Re, and the chalcogen material may be at least one of S, Se, and Te. The TMDC material may be expressed as a chemical formula of $MX_2$. Here, X may be a chalcogen element, for example, S, Se, Te, etc. Also, M may be a transitional metal, for example, Mo, W, Nb, V, Ta, Ti, Zr, Hf, Tc, Re, etc. More specifically, the TMDC material may be $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, etc.

The 2D material layer 13 may be formed by additionally doping with a dopant material. The 2D material layer 13 according to some example embodiments does not include an additional dopant material, and may be formed by including a 2D material.

The insulating layer 14 formed on the 2D material layer 13 may include, for example, hexagonal-boron nitride (h-BN) or $Al_2O_3$. h-BN is a 2D material that is very flat at an atom level and has a large band gap. When h-BN is formed on the 2D material layer 13, h-BN facilitates the contact of the first and second electrode layers 16a and 16b with the 2D material layer 13 at the edge region A11 of the 2D material layer 13 when the electronic device 100 according to some example embodiments is manufactured. h-BN may be formed on the 2D material layer 13 by using a Van der Waals transfer technique.

When the electronic device 100 according to some example embodiments is manufactured, the surface material layer 15 may be a material that may be used as a photoresist, and may include poly methyl methacrylate (PMMA). The surface material layer 15 may be selectively removed in the process of manufacturing the electronic devices 100 according to some example embodiments.

Figure 3B:
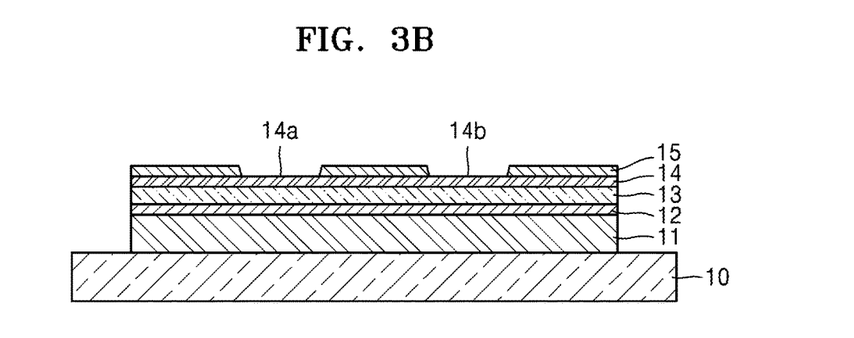

Referring to FIG. 3B, the surface material layer 15 on a location where electrodes are formed is removed by patterning the surface material layer 15. The patterning process of the surface material layer 15 may be a lithography process.

Figure 3C:
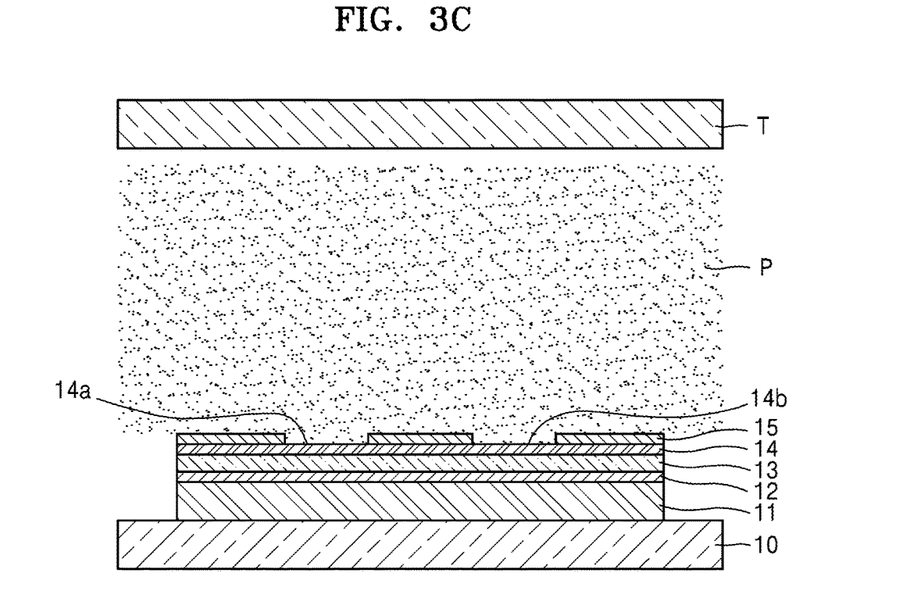

Referring to FIG. 3C, exposed insulating layers 14a and 14b between the patterned surface material layers 15 are etched by using the patterned surface material layer 15 as an etch mask. At this point, a dry etching process may be performed by using plasma P generated by a tool T configured to perform an inductively coupled plasma (ICP) process. The 2D material layer 13 and the insulating layer 14 on the gate insulating layer 12 may be etched by a plasma etching process. When the 2D material layer 13 includes $MoS_2$, an $O_2/SF_6$ plasma process may be used.

Figure 3D:
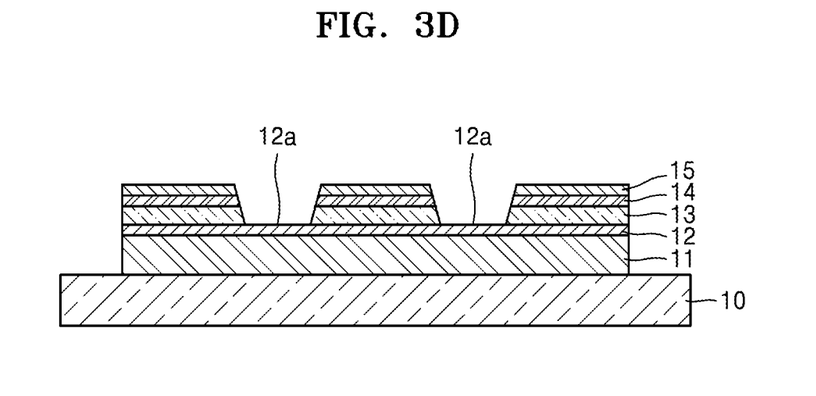

Referring to FIG. 3D, regions of the insulating layer 14 and the 2D material layer 13 exposed by the patterned surface material layer 15 may be removed by etching. Accordingly, some surface regions 12a and 12b of the gate insulating layer 12 may be exposed.

Figure 3E:
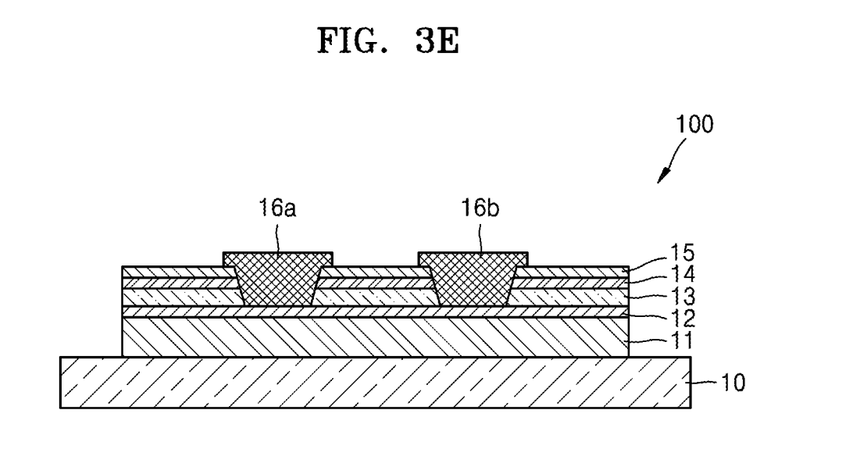

Referring to FIG. 3E, the first and second electrode layers 16a and 16b may be formed on the surface regions 12a and 12b of the exposed gate insulating layer 12 between the patterned surface material layers 15 by forming a conductive material so that the first and second electrode layers 16a and 16b contact edge regions of the 2D material layer 13. When the first and second electrode layers 16a and 16b are formed of a material having a work function greater than 5.0 eV, the electronic device 100 according to some example embodiments may be formed as a p-type electronic device in which the 2D material layer 13 which is a channel layer and the first and second electrode layers 16a and 16b form a p-type contact.

The electronic device 100 according to some example embodiments may be formed as a p-type electronic device, for example, a transistor, by forming the electronic device 100 using a conductive material having a high work function, and also, may be formed as an ambipolar electronic device by forming the electronic device 100 using a conductive material having a low work function.

Figure 4:
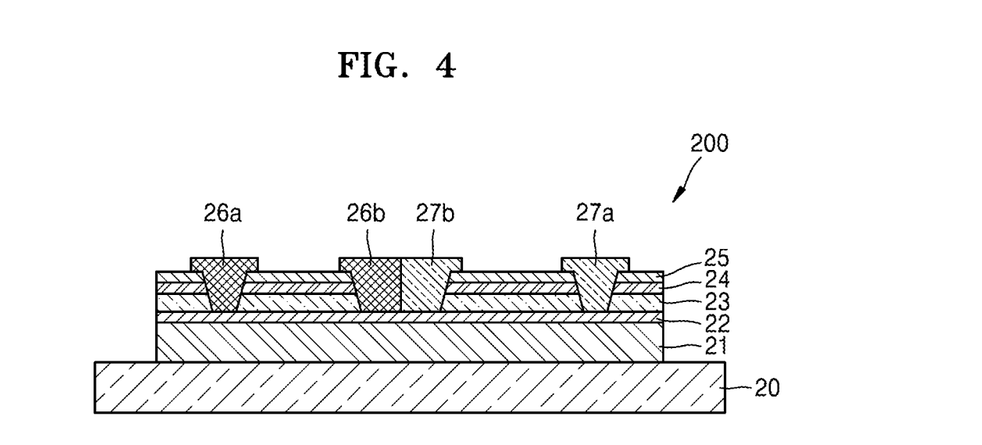
FIG. 4 is a schematic cross-sectional view of an ambipolar electronic device including a 2D material layer, according to some example embodiments.
Figure 5:
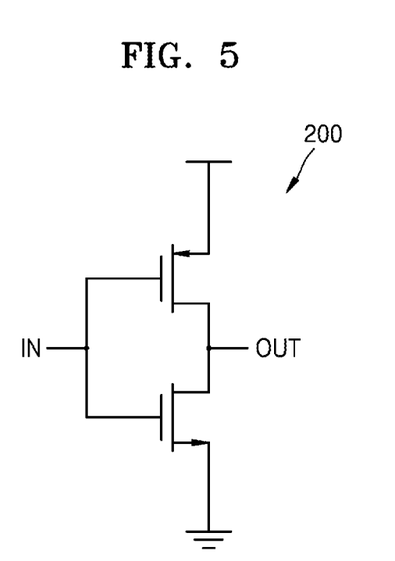
FIG. 5 is a circuit diagram of an electronic device including a 2D material layer according to some example embodiments of FIG. 4.
Figure 6:
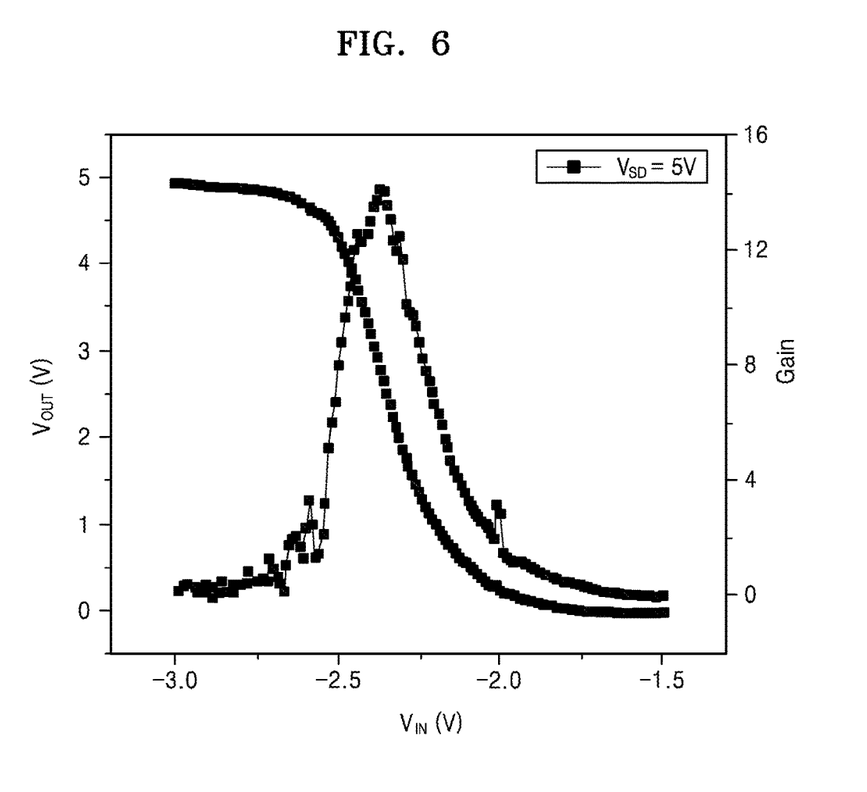
FIG. 6 is graph illustrating electrical characteristics of an electronic device according to some example embodiments.

FIG. 4 is a schematic cross-sectional view of an ambipolar electronic device 200 including a 2D material layer according to some example embodiments. In FIG. 4, an inverter structure is shown as an ambipolar electronic device. FIG. 5 is a circuit diagram of an electronic device according to some example embodiments of FIG. 4. FIG. 6 is graph illustrating electrical characteristics of an electronic device according to some example embodiments.

Referring to FIG. 4, the ambipolar electronic device 200 according to some example embodiments may include a gate electrode 21 on a lower structure 20, a gate insulating layer 22 on the gate electrode 21, a 2D material layer 23 on the gate insulating layer 22, and an insulating layer 24 on the 2D material layer 23. A surface material layer 25 may be optionally formed on the insulating layer 24.

Also, the ambipolar electronic device 200 may include a 1-1 electrode layer 26a and a 1-2 electrode layer 26b formed of a material having a low work function and a 2-1 electrode layer 27a and a 2-2 electrode layer 27b formed of a material having a high work function respectively on regions of the gate insulating layer 22 on which some regions of stacked the 2D material layer 23, the insulating layer 24, and the surface material layer 25 are removed. The 1-1 electrode layer 26a may formed to directly contact edge regions of the 2D material layer 23, the insulating layer 24, and the surface material layer 25 by forming on a first region of the gate insulating layer 22 exposed by removing some regions of the 2D material layer 23, the insulating layer 24, and the surface material layer 25. The 2-2 electrode layer 27b may be formed to directly contact edge regions of the 2D material layer 23, the insulating layer 24, and the surface material layer 25 by forming on a second region of the gate insulating layer 22 exposed by removing some regions of the 2D material layer 23, the insulating layer 24, and the surface material layer 25.

The 1-2 electrode layer 26b and the 2-1 electrode layer 27a may be formed by contacting each other on a third region between the first and second regions on which 1-1 electrode layer 26a and the 2-2 electrode layer 27b respectively are formed. The second and third electrode layers 26b and 27a may be formed to directly contact edge regions of the 2D material layer 23, the insulating layer 24, and the surface material layer 25 by forming on the third region of the gate insulating layer 22 exposed by removing some regions of the 2D material layer 23, the insulating layer 24, and the surface material layer 25 are removed. The 1-2 electrode layer 26b may be formed adjacent to the 1-1 electrode layer 26a, and the 2-1 electrode layer 27a may be formed adjacent to the 2-2 electrode layer 27b.

The 1-1 electrode layer 26a and a 1-2 electrode layer 26b may include a conductive material having a low work function, that is, less than 5 eV, for example, Mo, and the 2-1 electrode layer 27a and the 2-2 electrode layer 27b may include a conductive material having a high work function, that is, greater than 5 eV, for example, Pd. Accordingly, a p-type contact may be formed on the edge regions of the 2D material layer 23 that contact the 1-1 electrode layer 26a and a 1-2 electrode layer 26b, and an n-type contact may be formed on the edge regions of the 2D material layer 23 that contact the 2-1 electrode layer 27a and the 2-2 electrode layer 27b. Accordingly, the ambipolar electronic device 200 according to some example embodiments of FIG. 4 may be formed as an electronic device having an ambipolar characteristic, for example, an inverter. In FIG. 5, a circuit diagram of the ambipolar electronic device 200 of FIG. 4, that is, an inverter is shown. In FIG. 5, an input signal IN is applied through the gate electrode 21, and an output signal OUT may be obtained through the 1-2 electrode layer 26b and the 2-1 electrode layer 27a.

Referring to FIG. 6, a non-limiting example of the electronic device 200 in FIG. 4 was made using a gate insulating layer 22 formed of $Al_2O_3$, a 2D material layer 23 formed of $MoS_2$, a 1-1 electrode layer 26a and a 1-2 electrode layer 26b formed of Pd, a 2-1 electrode layer 27a and a 2-2 electrode layer 27b formed of Mo. As shown in FIG. 6, the electronic device 200 had a gain of about ~14.7 at a source-drain voltage Vsd of 5 V.

An electronic device according to some example embodiments may be used in various types. Examples of the electronic device may be transistors of various structures, for example, a field effect transistor (FET) or a thin film transistor (TFT), and also, may be various electronic devices, such as a diode, a memory device, a logic device, a solar cell, or a display device.

According to some example embodiments of inventive concepts, a Fermi level pinning effect of a 2D material layer may be limited and/or prevented by contacting an edge of the 2D material layer with an electrode layer.

Also, a material for forming the electrode layer that contacts an edge of a 2D material layer may be appropriately selected according to work function, and thus, an electronic device having an ambipolar characteristic may be provided.

While some example embodiments have been particularly shown and described, it will be understood by one of ordinary skill in the art that variations in form and detail may be made therein without departing from the spirit and scope of the claims. Those of ordinary skill in this art know that the connection structure of the 2D material layer and an electrode layer may be applied to various electronic devices by modifying the connection structure. Therefore, the scope of inventive concepts is limited by the detailed description above.

What is claimed is:

1. An electronic device comprising:
a gate electrode;
a gate insulating layer on the gate electrode;
a two-dimensional (2D) material layer on the gate insulating layer above the gate electrode;
an insulating layer on the 2D material layer, the insulating layer including an opening that exposes the 2D material layer, wherein the insulating layer includes one of h-BN and $Al_2O_3$; and
an electrode layer contacting an edge of the 2D material layer, the electrode layer having a high work function, the electrode layer being configured to cause a p-type characteristic in the 2D material layer without doping the 2D material layer, the electrode layer directly contacting the edge of the 2D material layer through the opening in the insulating layer.

2. The electronic device of claim 1, wherein the electrode layer has a work function in a range from 5.0 eV to 6.5 eV.

3. The electronic device of claim 1, wherein the electrode layer is on a surface of the gate insulating layer.

4. The electronic device of claim 3, wherein
the electrode layer includes a first electrode layer and a second electrode layer respectively,
the opening in they insulating layer includes a first opening and a second opening that are separate from each other,
the first electrode layer and the second electrode layer directly contact edges of the 2D material layer on the surface of the gate insulating layer.

5. The electronic device of claim 1, wherein the 2D material layer includes a transition metal chalcogenide based material.

6. The electronic device of claim 5, wherein the 2D material layer includes one of $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, and $ReSe_2$.

7. The electronic device of claim 1, wherein the insulating layer includes h-BN.

8. The electronic device of claim 1, wherein
the electrode layer includes a first electrode layer and a second electrode layer, respectively,
the first electrode layer and the second electrode layer contact edges of the 2D material layer and have work functions that are different from each other.

9. The electronic device of claim 8, wherein
the first electrode layer has a work function greater than 3 eV and less than 5 eV, and
the second electrode layer has a work function in a range from 5.0 eV to 6.5 eV.

10. The electronic device of claim 9, wherein
an n-type contact region on a region where the first electrode layer contacts a first one of the edges of the 2D material layer, and
a p-type contact region is arranged on a region where the second electrode layer contacts a second one of the edges of the 2D material layer.

11. The electronic device of claim 8, wherein the 2D material layer includes a transition metal chalcogenide based material.

12. The electronic device of claim 8, wherein the 2D material layer includes one of $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, and $ReSe_2$.

13. The electronic device of claim 1, wherein the insulating layer includes $Al_2O_3$.

14. The electronic device of claim 1, wherein a bottom surface of the electrode layer is on top of a top surface of the gate insulating layer.

15. The electronic device of claim 8, wherein a bottom surface of the electrode layer is on top of a top surface of the gate insulating layer.

16. The electronic device of claim 9, wherein
the first electrode layer is configured to impart an n-type characteristic in a first region of the 2D material layer that contacts the first electrode layer, and
the second electrode layer is configured to impart a p-type characteristic in a second region of the 2D material layer that contacts the second electrode layer without doping the 2D material layer.

* * * * *